United States Patent [19]
Fasbender et al.

[11] 3,948,701
[45] Apr. 6, 1976

[54] PROCESS FOR MANUFACTURING BASE MATERIAL FOR PRINTED CIRCUITS

[75] Inventors: Helmut Fasbender; Horst Hirschfeld, both of Kassel, Germany

[73] Assignee: AEG-Isolier-und Kunststoff GmbH, Kassel, Germany

[22] Filed: Oct. 2, 1974

[21] Appl. No.: 511,493

Related U.S. Application Data

[63] Continuation of Ser. No. 271,760, July 14, 1972, abandoned.

[30] Foreign Application Priority Data

July 20, 1971 Germany............................ 2136212
July 20, 1971 Germany...................... 7127826[U]

[52] U.S. Cl. ................ 156/3; 156/155; 156/230; 156/253; 428/460; 428/463; 428/901
[51] Int. Cl.²... C23F 1/00; H05K 1/00; B32B 31/22
[58] Field of Search ........... 156/230, 231, 238, 241, 156/3, 253, 155; 161/406, DIG. 7, 215, 218; 428/461, 463, 460, 901

[56] References Cited
UNITED STATES PATENTS

| | | | |
|---|---|---|---|
| 2,070,596 | 2/1937 | Hansen | 161/406 |
| 2,318,096 | 5/1943 | Quick | 117/36.4 |
| 2,692,190 | 10/1954 | Pritikin | 161/DIG. 7 |
| 2,990,310 | 6/1961 | Chan | 156/253 X |
| 3,171,756 | 2/1965 | Marshall | 161/DIG. 7 |
| 3,212,913 | 10/1965 | Mackenzie | 156/230 X |
| 3,625,758 | 12/1971 | Stahl et al. | 117/212 |
| 3,689,332 | 9/1972 | Dietrich et al. | 156/3 X |
| 3,784,440 | 1/1974 | Grunwald et al. | 161/215 |

FOREIGN PATENTS OR APPLICATIONS 1,187,061  4/1970  United Kingdom

*Primary Examiner*—Harold Ansher
*Attorney, Agent, or Firm*—Spencer & Kaye

[57] ABSTRACT

In a process for making a printed circuit, a method of forming a base for the circuit, including coating a cover foil with a decomposable film, then bonding the film to a carrier, and then removing the cover foil from the film.

A protected base useful for making printed circuits, comprising a synthetic-resin-based carrier, a decomposable adhesive film bonded to the carrier, and a removable cover foil bonded to the film, the adhesive film containing catalyst effective for the electroless deposition of metal conductors.

3 Claims, 5 Drawing Figures

PROCESS FOR MANUFACTURING BASE MATERIAL FOR PRINTED CIRCUITS

CROSS REFERENCE TO RELATED APPLICATION

This application is a continuation of Application Ser. No. 271,760, filed July 14th, 1972 now abandoned.

BACKGROUND OF THE INVENTION

The present invention relates to a protected base useful for making printed circuits and to a method, in a process for making a printed circuit, of forming a base for a printed circuit. More particularly, the present invention relates to the manufacture of a base material for printed circuits, which base material includes a carrier material and a decomposable surface film on the carrier material, and to the applying of the surface film on the carrier material in preparation for the forming of a printed circuit according to the additive technique of making such circuits.

It is already known to produce a base material by bonding resin-impregnated plies together under pressure, then to roughen the surface of the resulting layered press-material, and finally to apply an adhesive film. The application of the adhesive film can also be done on a carrier material, which is not a laminated press material. For example, polytetrafluoroethylene and polyphenylene oxide have been used as the carrier material.

The applying of the adhesive film can be carried out by immersion, or by pouring out a coating onto the carrier. It is usually done on small platforms of carrier material which have been previously cut to size for the intended printed circuit.

The settling of dirt onto the resulting adhesive surface has been avoided only by taking special care to place the finished article in dust-free surroundings. Dust that does get onto the surface of the adhesive can cause flaws in the printed circuit end-product.

In the case where the adhesive film has been applied by the pouring of a coating, it has been the practice to coat first the top or bottom side of the carrier material, then to dry, and then to repeat the process for the remaining side. This causes differences in hardness on the top and bottom sides, because the side which has been coated first undergoes two drying treatments.

SUMMARY OF THE INVENTION

An object of the present invention, therefore, is to provide an improved base useful for making printed circuits and to provide a printed circuit manufacturing process which includes a method for forming a base for the circuit, which base has a carrier-mounted surface film substantially free of impurities, having a substantially uniform layer thickness, and being of the same hardness on the top side as on the bottom side of the carrier.

Another object of the present invention is to provide a method for forming a base for a printed circuit, which method does not require that the carrier material first be cut to size, before the surface film is applied.

These as well as other objects which will become apparent in the discussion that follows are achieved, according to the present invention, by:

1. A process for making a printed circuit, which process is characterized by a method of forming a base for the circuit, which method comprises the steps of coating a cover foil with a decomposable film, then bonding the film to a carrier, and then removing the cover foil from the film; and 2. A protected base useful for making printed circuits, comprising a synthetic-resin-based carrier, a decomposable adhesive film bonded to the carrier, and a removable cover foil bonded to the film, the adhesive film containing catalyst means for the electroless deposition of metal conductors.

GENERAL ASPECTS OF THE INVENTION

Thus it will be appreciated that the objects of the invention are achieved, according to the present invention, by providing a cover foil with an adhesive film, then bonding the film on the foil to a carrier material, and later removing the cover foil from the film just before its decomposition. In this way, the chances for dirt to get on the film are significantly lessened. The film can be applied to the cover foil using, for example, a rolling of the film material onto the foil, a spreading by a doctor blade, or a pouring technique.

The covering of the adhesive film to be applied to the carrier material to form the protected base of the invention prevents disturbing dirt particles from depositing on the adhesive film after manufacture of the base. The application of the film on the cover foil can be carried out uniformly and continuously, so that a constant film thickness is assured. The film thickness is always the same value, no matter what point on the foil is considered. At the same time, the degree of preliminary hardening (i.e. the degree of preliminary condensation in the case of hardening by the condensation mechanism) of the organic polymer film can be chosen by selecting the curing time and temperature for the film on the foil, before the bonding of the film to the carrier, so that the film is largely freed of volatile reaction products which would otherwise later mean a poor performance as regards soldering. Furthermore, the strength of the bond between the carrier body and the film can be adjusted by varying the degree of preliminary hardening, so that particular demands placed on the base or finished printed circuit can be met. In the method of the present invention, dirt particles will be located, if at all, only between the laminated carrier and the adhesive film, or within the body of the adhesive film. The surface of the film at the interface between the foil and the film, which surface will later form the exposed surface of the film, remains protected by the cover foil during the application of the film to the carrier material. Furthermore, film can be applied to both the top and bottom surfaces of a carrier at the same time, for example by pressing, and this assures the same degree of hardness in the film on both sides of the carrier.

The present invention makes it possible to manufacture a base material having a desired surface film by using a carrier in whatever dimensions it is manufactured; it is not necessary to first cut the carrier material into final, more limited, platform dimensions.

DESCRIPTION OF THE PREFERRED EMBODIMENTS

Figure 1:
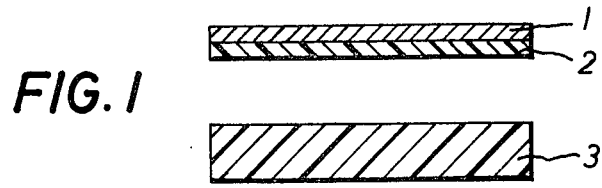
FIG. 1 is an elevational, cross-sectional view of structural parts at one point in a process according to the invention.

Referring firstly to FIG. 1, there is shown, schematically and in cross section, a cover foil 1 and an adhesive film 2 coated onto the foil. The film surface at the interface between foil and film is protected by the foil from acquiring impurities during further processing. Carrier 3 is a stack of resin-impregnated plies bonded together under heat and pressure. The surface of film 2 opposite to that bonded to foil 1 is to be pressed against carrier 3 for the purpose of bonding the film to the carrier.

Figure 2:
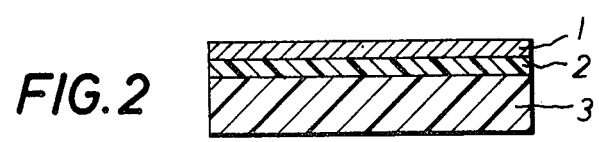
FIG. 2 is an elevational, cross-sectional view of a protected base according to the invention and additionally illustrates another point in time in a process according to the invention.

FIG. 2 shows the resulting, protected base after the pressing of the foil/film unit against the carrier. This protected base, which is useful for making printed circuits, includes a cover foil 1, for example of metal, which covers the surface of the adhesive film 2 on the resin-impregnated plies 3. Film 2 and carrier 3 form here the printed circuit base, with foil 1 being the protection. The adhesive film and the carrier material can be composed of a polymer which contains catalysts, known per se, for the electroless deposition of conductive paths; or the film and carrier can contain a non-catalyzed material. In the case of catalysts, the film, for example, has an adhesive resin base having dispersed throughout finely divided particles of an agent, as catalyst, which is receptive to electrolessly deposited copper. The receptive agents dispersed throughout the resin base may be finely divided metal or metal oxides, such as copper, zinc, or copper oxides. The carrier materials having incorporated therein the active agent for reception of the electroless copper deposit may be impregnated laminates of paper or cloth or Fiberglas. The resin impregnant for such laminates includes phenolics, epoxies, polyesters, and the like.

Figure 3:
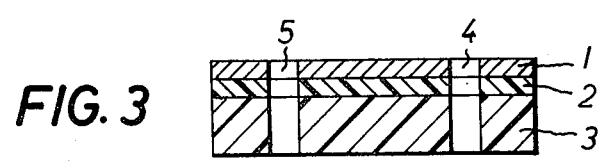
FIGS. 3 to 5 are views as in FIG. 2 of further points in time for variants according to the present invention.

FIG. 3 shows the foil-covered base material of FIG. 2 with the addition of holes 4 and 5, which have been drilled for the purpose, for example, of providing electrical connection between the individual layers of a multilayer conductor sheet, such as that disclosed in U.S. Pat. No. 3,634,602 issued Jan. 11th, 1972, to Karl vom Bruck. This is one example of where it can be advantageous to provide catalytic material in both the carrier 3 and the film 2, since then the inner walls of holes may be plated electrolessly to get the desired electrical connection between the individual layers of a multilayer conductor sheet.

The carrier material can be made using resin-impregnated plies, known per se, which are pressed in known manner under the simultaneous application of pressure and heat into a laminated, pressed material. The material for the cover foil can be both organic and inorganic, and in particular it can be metal. Aluminum foils have proven especially advantageous as cover foils for the present invention. The aluminum foil is dissolved away from the film bonded to the carrier using, for example, an etchant for the aluminum.

The use of aluminum foil or other metal foil as the cover foil according to the present invention is of considerable advantage for the practice, common in the art of printed circuit manufacture, of piling several bases together and then drilling a hole down through the resulting stack. Thus, it will be evident from the above-referenced U.S. Pat. No. 3,634,602 that it can be required in this art that the holes, such as holes 4 and 5 in the present FIG. 3, of one printed circuit base be lined up with holes in other bases in a multilayer conductor sheet. When the bases are protected by a metal foil 1 according to the present invention, the various foils in a stack being drilled serve to provide an improved extraction of heat out of the individual bases. A smearing of the material of the adhesive films on to the walls of the holes is reliably avoided. Any small chips of aluminum that might get pressed into the walls of the holes can be removed by chemical means, easily and completely, in contrast to the situation for other cover foil material, such as organic polymer materials.

Figure 4:
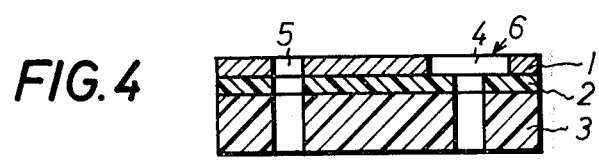
Figure 5:
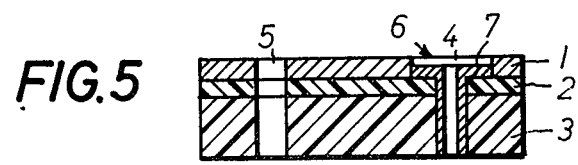

According to a further development of the present invention, the cover foil is not removed completely after the holes have been drilled. Rather, it is removed only at those locations where conductive paths are to be produced according to the additive technique. The fundamentals of the additive technique are set forth, for example, on page 5–56 of the PRINTED CIRCUITS HANDBOOK by Clyde F. Coombs, Jr., McGraw-Hill Book Company, 1967. For example, aluminum is removed along a path 6 intersecting with hole 4, as shown in FIG. 4. Then, the base is immersed in an electroless copper plating bath, where catalyst in both film 2 and carrier 3 cause copper conductive path 7 to be deposited in both path 6 and hole 4.

Laminated glass cloth is an example of a suitable material for carrier 3. Preferably, the impregnating resin for this laminated glass cloth is based on epoxy resin, with "E" type (see pages 232 and 234 of MODERN PLASTICS ENCYCLOPEDIA, Vol. 48, No. 10A, Oct. 1971, McGraw-Hill Book Company) glass serving as the glass fiber material. Preferred bonding agents are epoxy resins based on bisphenol, for example those with an epoxy equivalent (the epoxy equivalent is determined by dividing the average molecular weight by the average number of epoxide groups in the average molecule) of 500; these resins are mixed with a hardener, for example a hardener based on dicyandiamide. The laminated cloth contains preferably 40% by weight resin.

Preferred materials for film 2 are, for example, copolymers of acrylonitrile and butadiene in combination with phenolic resins, with fillers and additives as required.

A preferred cover foil is aluminum foil having a thickness of about 25 microns; however, other metal foils, for example those based on tin, can be used.

The carrier material can be a laminated and pressed material, solely a polymer material, or an inorganic material such as, for example, ceramic. It is possible to use a thermoplastic as the carrier.

The decomposition or removal of the film 2 can be carried out in conventional manner mechanically, chemically or in other ways for improving the bond strength of the metal coating to be applied.

EXAMPLE

In preparing the adhesive film on the cover foil, the first operation involves treating an aluminum foil having a thickness about 25 μm with a solution comprising

| 11 % | by weight | of acrylnitril-Butadien-Copolymerisat (Perbunan N 3810-Farbenfabriken Bayer) |
|---|---|---|
| 3 % | " | Chlorosulfonated Polyethylene (Hypalon 20-Du Pont) |
| 9 % | " | Fillers |
| 0,4 % | " | Silan A 172 (Union Carbide Comp.) |

-continued

| | | |
|---|---|---|
| 10,4 % | " | Vinyl silane sold under the tradename Alkylphenolic resin VL 6172 (Bakelite,Germany) |
| 66,2 % | " | Ethylaceticacidester |

The solution is diluted with methyl-ethyl-Ketone (MEK) to 18% by weight of the concentration of solids.

The wet coating is made up to 150 g/m², the coating after drying forms a film of 30 μm thickness. The coated Al-foil is moved through a drying oven with a time rate of motion of ca. 0,5 m/min., being maintained at a temperature of 150° – 160° C.

While drying the film to remove the volatile content down to 2% a non tacky surface film is obtained. The cover foil with the surface film is bonded to a carrier. The carrier material is laminated material comprising prepregs of woven cloth from fibrous glass yarns impregnated with an epoxy resin containing

| | | |
|---|---|---|
| 100 | parts by weight | of an unmodified epoxy resin based of bisphenol A, Epoxyequivalent about 450–500 |
| 4 | " | Dicyandiamid |
| 0.3 | " | Benzyldimethylamin |

The aluminum foil with the surface film and the resin-impregnated plies are pressed under application of pressure of 80 kp/cm² at a temperature of 170° C during a time of ca. 90 minutes. The pressed foil covered base material is removed from the press after cooling to room temperature. The base material protected by the cover foil applied to both the top and bottom of the carrier may be cut to final size into panels.

The Al-foil is removed after drilling of holes by immersing the base material in a 10% solution of hydrochloric acid.

The decomposition of the film can be carried out in conventional manner. The purpose of rendering the surface of the film decomposed is to promote the surface more reactive for chemically depositing a conductor metal plate by electroless deposition.

It will be understood that the above description of the present invention is susceptible to various modifications, changes and adaptations and the same are intended to be comprehended within the meaning and range of equivalents of the appended claims.

We claim:

1. In the manufacture of base material for printed circuits comprising a resin impregnated carrier material and a chemically decomposable heat-hardenable resinous adhesive film on a surface of said carrier, the improvement comprising coating an aluminum foil with an adhesive film of an acrylonitrile-butadiene copolymer in combination with a phenolic resin as said decomposable heat-hardenable resinous adhesive film, placing the film side of the thus-coated foil on a surface of the resin impregnated carrier material, bonding said film to said carrier material by applying heat and pressure thereto to form a pressed base material having a foil which can be etched away to expose an adhesive surface which is substantially free of impurities and etching away metal foil from the film before a circuit is formed on said base material.

2. In a process for making a printed circuit, a method as claimed in claim 1, further comprising the step of decomposing at least some of said film immediately after the step of etching away.

3. The improvement as claimed in claim 1 further comprising drilling a hole through the metal foil, film and base material before the step of etching away.

* * * * *